(12) United States Patent
Vershinin et al.

(10) Patent No.: US 10,090,830 B2
(45) Date of Patent: Oct. 2, 2018

(54) SWITCH APPARATUS

(71) Applicant: General Electric Technology GmbH, Baden (CH)

(72) Inventors: Konstantin Vershinin, Stafford (GB); Jonathan Nicholls, Derby (GB)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 0 days.

(21) Appl. No.: 15/549,640

(22) PCT Filed: Feb. 11, 2016

(86) PCT No.: PCT/EP2016/052945
§ 371 (c)(1),
(2) Date: Aug. 8, 2017

(87) PCT Pub. No.: WO2016/128526
PCT Pub. Date: Aug. 18, 2016

(65) Prior Publication Data
US 2018/0069543 A1    Mar. 8, 2018

(30) Foreign Application Priority Data

Feb. 12, 2015  (EP) .................................... 15154828

(51) Int. Cl.
*H03K 17/16*    (2006.01)
*H03K 17/10*    (2006.01)
(Continued)

(52) U.S. Cl.
CPC ......... *H03K 17/102* (2013.01); *H01H 33/596* (2013.01); *H02M 1/088* (2013.01);
(Continued)

(58) Field of Classification Search
CPC ........................... H03K 17/102; H03K 17/107
(Continued)

(56) References Cited

U.S. PATENT DOCUMENTS

| 4,665,458 A | | 5/1987 | Matsuoka et al. |
| 5,566,063 A | | 10/1996 | Gerster et al. |
| 5,999,388 A | * | 12/1999 | Asplund ................ H02H 3/087 |
| | | | 323/908 |

FOREIGN PATENT DOCUMENTS

| WO | 2010/088969 A1 | 8/2010 |
| WO | 2014/154265 A1 | 10/2014 |

OTHER PUBLICATIONS

Extended European Search Report and Opinion issued in connection with corresponding EP Application No. 15154828.6 dated Aug. 12, 2015.

(Continued)

*Primary Examiner* — Thomas Skibinski
(74) *Attorney, Agent, or Firm* — GE Global Patent Operation; Scott R. Stanley

(57) ABSTRACT

An apparatus and methods of breaking a circuit using a switch are disclosed. In an example, a variable voltage is applied across a switch, which comprises a series connection of switching elements which are individually controllable between a blocking state and a conductive state. The state of the switching elements is controlled such that at least a portion of switching elements are in the blocking state, and fewer switching elements are in the blocking state when the applied voltage magnitude is low than when the applied voltage magnitude is high.

19 Claims, 6 Drawing Sheets

(51) Int. Cl.
  *H02M 1/088* (2006.01)
  *H02M 1/32* (2007.01)
  *H03K 17/082* (2006.01)
  *H03K 17/689* (2006.01)
  *H01H 33/59* (2006.01)
  *H02M 7/483* (2007.01)
  *H02H 3/20* (2006.01)

(52) U.S. Cl.
  CPC .............. *H02M 1/32* (2013.01); *H02M 7/483* (2013.01); *H03K 17/0828* (2013.01); *H03K 17/107* (2013.01); *H03K 17/689* (2013.01); *H02H 3/20* (2013.01)

(58) Field of Classification Search
  USPC .......... 327/387, 388, 427, 434, 437; 363/98, 363/123; 361/58
  See application file for complete search history.

(56) References Cited

OTHER PUBLICATIONS

International Search Report and Written Opinion issued in connection with corresponding PCT Application No. PCT/EP2016/052945 dated Apr. 12, 2016.

\* cited by examiner

SWITCH APPARATUS

FIELD OF THE INVENTION

The invention relates to switch apparatus, and in particular but not exclusively to switches comprising a plurality of series connected switching elements and the control thereof.

BACKGROUND OF THE INVENTION

Particular problems exist with operating switches in relatively high voltage environments. For example, in a mechanical switch, arcing can occur on opening, in which ionisation of the air between separating contacts allows the air to act as a conductor. This is potentially dangerous in itself and also causes wear to the equipment, which therefore requires regular review and renewal.

Solid state switches (i.e. semiconductor switches such as Integrated Gate Bipolar Transistors (IGBTs), Metal-Oxide Semiconductor Field-Effect Transistors (MOSFETS), and the like) do not suffer from arcing, but currently available solid state switches are not generally able to support the full voltage of a relatively high voltage environment and/or switches which can support higher voltages are expensive. This means that, where they are used in a high voltage environment, it is usual to provide several (in some example up to a hundred or more) solid state switching elements connected in series to provide a switch.

In such a series connection, there is usually a need to balance or share voltages over a series connections of switching elements to ensure that no one switching element is required to support in excess of the maximum voltage allowed voltage for that switching element (the maximum voltage advised is known as the 'voltage rating' of the switching element), usually by ensuring that the voltage supported is equal or close to equal across all the switching elements in the series connection.

SUMMARY OF THE INVENTION

According to a first aspect of the invention, there is provided a method of breaking a circuit using a switch, wherein a variable voltage is applied across the switch and the switch comprises a series connection of switching elements which are individually controllable between a blocking state and a conductive state, the method comprising controlling the state of the switching elements such that at least a portion of switching elements are in the blocking state, wherein fewer switching elements are in the blocking state when the applied voltage magnitude is low than when the applied voltage magnitude is high.

Effectively, this allows the voltage supporting capability of the switch to be (at least to an approximation) matched to the actual voltage which the switch is required to support. Viewed another way, the method allows the effective rating of the switch (i.e. the total of the individual ratings of the switching elements in the blocking state) to vary with the voltage applied.

It will be appreciated that the term 'blocking' in relation to a switch or switching element means that any flowing current would be blocked by a switch (i.e. it is 'open' or 'off'), whereas the term 'conductive' means that the switch/switching element is in a condition of conduct electricity (i.e. 'closed' or 'on'), whether or not current is actually flowing through the switching element. It will further be appreciated that the terms 'high' and 'low' are intended as relative terms to be understood within the context of the variable voltage applied, and are not indicative of absolute voltage values.

Varying the number of switching elements with the voltage has certain advantages. For example, when compared to an arrangement in which, in order to break a circuit, all the switching elements of a switch are placed in a blocking state regardless of voltage applied, operation of the method may result in the average number of switching events per switching element being reduced, which may in turn increase its lifespan. Further advantages may be associated with related 'auxiliary' circuitry such as voltage sharing circuitry or power harvesting circuitry, which may be optimised for a smaller range of voltages. Alternatively or additionally, hotter switching elements may be allowed to cool before being operated, possibly increasing the lifespan of a switching element by limiting thermal stress and/or reduce cooling requirements. Other advantages are discussed herein.

The portion may comprise a variable number of switching elements, which may vary with voltage magnitude. This number may be at least the number required to perform the breaking function bearing in mind the variable voltage form (it will be understood that switching elements may have a voltage above which they break down, at which point in some examples they becoming conductive, in other cases being destroyed), while not being all the switching elements at all voltages.

In some examples, the portion may be the smallest number of switching elements required to perform the breaking function given the applied voltage. However, as will be appreciated by the skilled person, circuits often include a degree of redundancy in the event that, for example, due to damage or manufacturing differences, a particular switching element cannot support its declared 'rated' voltage and therefore in an embodiment to have additional switching elements in the blocking state. The additional number of switching elements placed in the blocking state may be an absolute number, perhaps 1-5 additional switching elements for example, determined such that the summed voltage rating of the switching elements in the blocking state exceeds the actual or anticipated voltage by at least a predetermined percentage, for example by at least 0.01-10%, and/or defined such that each switch element supports at least a predetermined proportion of its rated voltage (for example, at least any value between 25%-100% of its of its rated voltage) assuming the voltage is correctly shared. These ranges are purely by way of example.

In some examples, the number of switching elements which make up the portion of switching elements in the blocking state may be determined using a combination of these considerations, for example, each switching element is required to support at least X % of its rated voltage as long as there are at least a predetermined number of surplus switching elements (to allow for failure of one or more switching element). The criteria for the determination may vary with the voltage.

In some examples, the applied voltage may have a form which varies between a minimum and a peak value and/or may have a predetermined voltage form. In some examples, the method may comprise controlling the state of at least one switching element in advance of a change in the applied voltage, simultaneously with a change in voltage, and/or after a change in voltage. This allows voltage changes to be anticipated such that an appropriate (i.e. sufficient, but not unduly excessive) number of switching elements may be controlled into the appropriate state. While controlling the state of the switching elements in advance of the voltage change may be desirable in the event of increasing voltage (i.e. the effective rating of the switch is increased before it is required), it may not be desirable for a decreasing voltage, in which the step of controlling the state may be carried out after a change in voltage. Whatever timing scheme is used for the rest of a switching cycle, initial or final state change(s) which place the switch as a whole in a conductive or blocking state may be carried out substantially simultaneously with a voltage change (i.e. the switch as a whole is controlled between a blocking state to a conductive state at the same time as a voltage change, thus allowing the switch to be in an appropriate state at the appropriate time).

The switching elements of a single switch may therefore be controlled according to any, any combination of, or all these timing strategies in a switching cycle. In one example, the method may comprise controlling the state of at least one switching element in advance of a change in the applied voltage for a first portion of the voltage form and after a change in voltage for a second portion of the applied voltage form. The method may further comprise controlling the state of at least one switching element simultaneously with a change in voltage for a third portion of the applied voltage form.

In some examples, the applied voltage comprises a stepped voltage form and the method comprises controlling the state of at least one switching element in advance of a step change in the applied voltage, simultaneously with a step change in the applied voltage, and/or after step change in the applied voltage. Such a stepped voltage form may for example be seen across an arm of an Alternate Arm Converter (AAC) or in a phase of a Series Bridge Converter (SBC), or a modular multilevel converter (MMC).

Where the voltage form is well known and predictable (as in an AAC, SBC or MMC), this allows for optimisation of the switching apparatus. While such a method could be used with any predetermined voltage form (for example a sawtooth or sinusoidal voltage form), if the voltage form is a stepped voltage it is relatively easy to anticipate when switching elements should be switched and there is a defined time period over which the switching can occur. As noted above, where the applied voltage has an increasing and a decreasing magnitude, as would be seen in a typical AAC for example, the step of controlling the state of at least one switching element may be carried out in advance of a step change which increases the magnitude of the applied voltage and after a step change which decreases the magnitude of the applied voltage.

In some such examples the method may comprise controlling the state of the switching elements such that the portion of switching elements in the blocking state changes in association with every step change in the applied voltage form. Closely tracking the voltage form allows the advantages associated with the method to be maximised. However, in other examples, in order to simplify switching and control, there may not be a change in the portion of switching elements in a given state associated with each voltage step. The method may comprise controlling the state of the switching elements such that the portion of switching elements in the blocking state changes after a predetermined number of step changes, or a predetermined voltage magnitude change, in the applied voltage form, or the like.

In some example, the switch may be arranged to operate in a relatively high voltage environment.

The step of controlling may comprise changing the state of at least one switching element, and may further comprise selecting which of the switching elements is/are controlled to change state according to a predetermined selection criteria.

The criteria may comprise a predetermined scheme: for example, the switching elements may be operated in a certain order in a predetermined switching scheme, which may in some examples have variable starting point. In some examples, the switching scheme may be selected considering the state of the apparatus in which the switch is employed: in a first operating state (e.g. normal operation), a first switching scheme may be utilised and in a second operating state (e.g. abnormal operation), a second switching scheme may be utilised. For example, during abnormal operation, all switching elements may be controlled into the blocking state simultaneously. In such examples, the selection criteria comprises selecting the switching element(s) according to the predetermined switching scheme.

Alternatively or additionally, the selection criteria may be to switch one or more switching element(s) indicated according to a random or pseudorandom selection method.

In still further examples, data indicative of a characteristic of at least one switching element and/or associated circuitry may be determined, and the step of selecting may be based on the determined data and the predetermined selection criteria.

In one example, the data may comprise data indicative of the switching element temperature, and the predetermined criteria may comprise a desirable threshold temperature or temperature range. This may allow the temperature of a switching element to be kept with a preferred range—for example to 'rest' hotter switching elements by leaving them in a conductive state to allow them to cool. In another example, a switching element which has displayed poor performance, or has degrading characteristics, may be kept as 'always on' to prevent it having an adverse effect on operation (this assumes that there are sufficient redundant switching elements that operation of every switching element is not required at peak voltages).

Alternatively or additionally, the data may comprise data indicative of the charge level of an energy storage device associated with one or more switching element(s), and/or indicative of one or more switching elements switch state history. As will be familiar to the skilled person, some circuits (which fall within the definition of 'auxiliary circuits' herein) 'harvest' energy from a voltage difference across a switching element, and as such, a switching element may be used as a voltage source for powering such auxiliary circuits. In examples, the energy may be used to power circuitry to provide a signal to control the state of the switching element itself, to provide power to the gating circuitry, to provide feedback of switching element status (e.g. blocking, conductive, fault, etc), or the like. Therefore, it could be determined that a switching element associated with an energy storage device having a lower charge, or a switching element which has not had sufficient time in a blocking state to allow energy to accumulate in an associated energy storage device (as determined from data indicative of the switching history of one or more switching elements), may be placed in the blocking state to allow the charge to build up.

In some examples, if a switching scheme is selected for an abnormal operation state, and if there is one or more auxiliary circuit which may assist in restoring normal operation and/or protecting the circuit during abnormal operation (for example snubber circuits and the like), then the needs of such circuits may be given more weight in an abnormal operation selection algorithm than during normal operation where, in some examples, status of the actual switching element, such as temperature or the like, may be given a higher weighting.

In some examples, the switching elements may functionally comprise a plurality of subsets of switching elements, and each subset is associated with an energy harvesting circuit capable of harvesting energy from all switching element in the subset when in the blocking state. In such examples, the method may comprise selecting a switching element according to the energy harvesting requirements from switching elements within a subset. For example, switch elements may be selected to be in the blocking state such that the cumulative time in the blocking state for the switching elements in a subset is (i) substantially equal and/or (ii) at least a threshold time period over a blocking state cycle. Alternatively, as set out above, the charge level of the energy harvesting circuit may be determined. As the switching elements may be in the blocking state (thus allowing energy harvesting) for a varying time period, this allows energy harvesting to be averaged over a number of switching elements. Such a method may also mean that energy from a first switching element, which may spend longer in its blocking state to be used in association (i.e. in a subset with) with a second, or other switching element(s), and thus provide more versatility in switching schemes.

According to another aspect of the invention, there is provided switch apparatus comprising a switch and a controller, wherein the switch is arranged to break an electrical circuit and to support an applied variable voltage and comprises a series connection of switching elements which are individually controllable between a blocking state and a conductive state; and the controller is arranged to control the state of the switching elements to break the circuit such that in use of the switch apparatus fewer switching elements are in the blocking state when the applied voltage low than when the applied voltage is high.

Such apparatus may therefore control switching elements such that the blocking capability of the switch (which is related to the number of switches in the blocking state) substantially or approximately tracks the applied voltage form.

The switch apparatus may be controlled according to the method of the first aspect of the invention.

In some examples, the switch apparatus comprises auxiliary circuitry arranged to control at least one function of at least one switching element, control or balance parameters between switching elements; and/or harvest energy from at least one associated switching element when the switching element is in the blocking state.

In one example, the auxiliary circuitry comprises voltage sharing apparatus arranged to share the applied voltage over any switching elements in the blocking state. As the skilled person will appreciate, such voltage sharing apparatus is sometimes provided to ensure that voltage is balanced across a series connection of devices such as switching elements, with no one device bearing a disproportionate voltage.

Such switch apparatus may be arranged such that, for all anticipated applied voltages, the current through the voltage sharing apparatus significantly exceeds the leakage current of the switching elements in the blocked state. Because the switch can be effectively sized according to the voltage, the voltage sharing apparatus may be sharing the voltage over switching elements which are at, or relatively close to their rated voltage limit (for example, the voltage supported may be a reasonable proportion, for example 60% or more, of their rated voltage).

In some examples, the voltage sharing apparatus comprises a grading resistor arranged in parallel with each switching element. Such an arrangement will be familiar to the skilled person. However in this example, as the switch can be effectively sized according to the voltage, the voltage sharing apparatus can be optimised for a narrower range of voltages than if all the switching elements always provide the voltage blocking function over low and high applied voltages.

In some examples, the applied voltage may change in quantised manner at known intervals, and the grading resistors are chosen so that the time constant associated with the output capacitance of the switching element and its associated grading resistor is less than the interval. This may remove or reduce the requirement for other voltage sharing apparatus such as capacitive snubber circuits.

In some examples, the switching elements comprise at least one of a first type of switching element and at least one of a second type of switching element.

The first type may be optimised for the change of the switch as a whole from a conductive to a blocking state. Even in cases where this step occurs at nominally zero current and/or at low voltage (as may be case in an AAC, MMC or SBC), it may be that such conditions cannot be guaranteed that therefore, in an embodiment, such switching elements may be arranged to support other current/voltage conditions. In some examples, therefore the first type of switching element selected to provide reasonable high current operation.

The second type of switching element may be arranged to maintain, rather than create, a blocking condition for the switch as a whole, and may therefore be selected to have a low voltage drop when in its conductive state.

The switching elements may further comprise a third type of switching element. For example, while a first type of switch may be used for the change of the switch as a whole from a conductive to a blocking state, the third type may be used for change of the switch as a whole from a blocking to conductive state. In some examples, the third type of switching element may have features in common with first type of switching element.

In some examples, the auxiliary circuitry comprises at least one energy harvesting device arranged to harvest and store energy from a potential difference across at least a first and a second switching element. In some examples, the apparatus may to use the harvested energy to (i) control the switching state of a switching element, (ii) power an auxiliary circuit associated with at least one switching element. As the switching elements may be in the blocking state (thus allowing energy harvesting) for a varying time period, this allows energy harvesting to be averaged over a number of switching elements. The arrangement may also mean that energy from a first switching element, which may spend longer in its blocking state to be used in association with the second switching device, and thus provides more versatility in switching schemes. For example, the controller may be arranged to control the switching elements such that the total time in the blocking state for switching elements associated with first energy storage device is substantially similar to the total time in the blocking state for switching elements associated with second energy storage device. The controller may be arranged to select which switching element should be in a blocking state based on at least one of: a predetermined switching pattern, random selection, pseudorandom selection, data indicative of a physical characteristic of at least one switching element (e.g. temperature), data indicative of the switch state history of at least one switching element, switching element type, the status of the apparatus in which the switching apparatus is employed, the status of any auxiliary circuitry. In relation to the status of the apparatus in which the switching apparatus is employed (for example, a converter or the like), in one example, in case of normal operation, a certain switching scheme may be used, while in case of abnormal operation a different scheme may be used.

In one example, the data indicative of the switch state history of at least one switching element determined using a transient voltage suppressor (TVS). As will be familiar to the skilled person, a TVS and associated circuitry may record how many times a switching element has been stressed. A TVS may be used in this way to monitor and/or protect aspects of the switching operation, such as the switching element itself, its gate driver and/or the gate driver power supply.

The switching apparatus may be arranged to provide a controller and a switch (for example a director switch) of an AAC, SBC or MMC. In some examples, the controller may function as the controller of the AAC, MMC or SBC.

According to another aspect of the invention, there is provided a controller for controlling a switch in a circuit having a variable voltage, the switch comprising a series connection of switching elements which are individually controllable between a blocking state and a conductive state, the controller being arranged to open the switch by controlling at least a portion of the switching elements to be in the blocking state such that fewer switching elements are in the blocking state when an applied voltage is low than when an applied voltage is high.

The controller may carry out the method of the first aspect of the invention and/or may have any of the features of the controller of the second aspect of the invention.

Features described in relation to one aspect of the invention may be combined with those of another aspect of the invention.

Embodiments of the in the invention are now described, by way of example only, with reference to the following Figures.

DETAILED DESCRIPTION OF EMBODIMENTS

Figure 1:
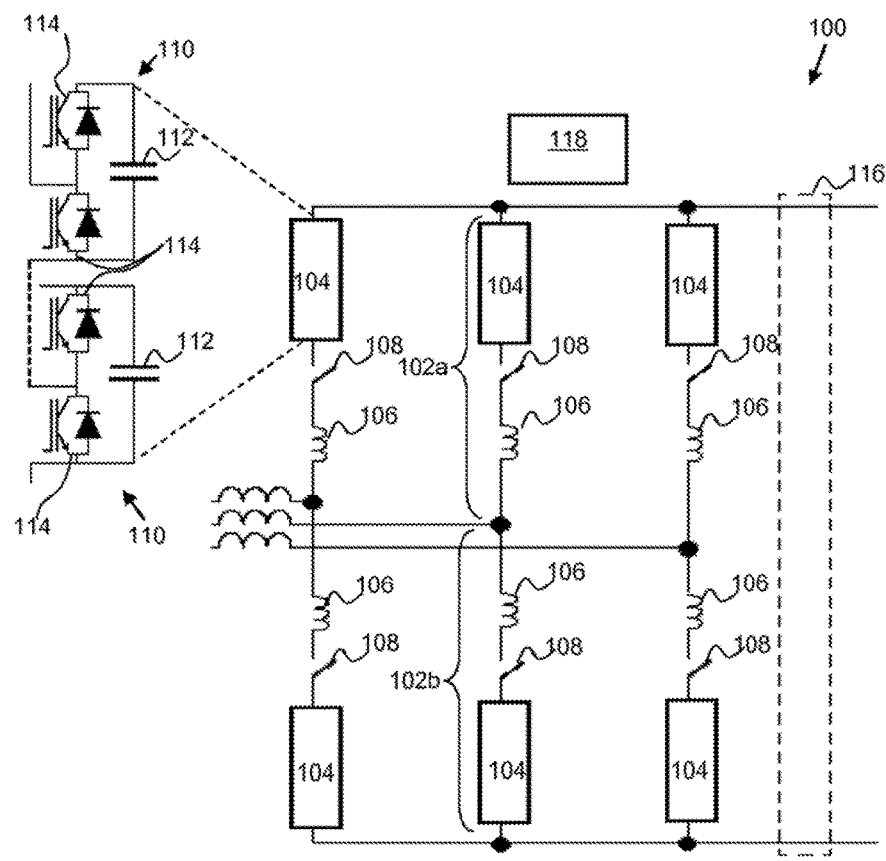
FIG. 1 shows an example of an Alternate Arm Converter.

For the purpose of example, an embodiment of the invention is now described in the context of an Alternate Arm Converter 100 (AAC), as shown schematically in FIG. 1. Each phase of the converter 100 has a pair of arms 102a, 102b (only labelled in relation to one of the pairs to avoid overcomplicating the figure). Each arm 102a, 102b comprises a stack of cells 104 arranged to synthesise a desired voltage, an arm inductor 106, and a director switch 108.

Two exemplary cells 110 that make up the stack of cells 104 in this example are shown in expanded view in FIG. 1. As can be seen, each of the cells 110 comprises an energy storage means, which in this example is a capacitor 112, which can be inserted into the circuit, blocked or bypassed in order to approximate an ac voltage according to the switching state of a number of switching elements 114. The stack 104 may be made up of many such cells 110. In this examples, the cells 110 have a half bridge design, but they could have other designs, such as a full bridge design.

The director switch 108 controls which arm 102 is used to conduct the ac current, with one arm 102 of each pair being used in each half cycle to approximate an ac voltage.

In this example, the converter 100 further comprises a DC filter circuit 116 to filter the DC voltage, and a controller 118 arranged to control the function of the converter 100, and in particular the switching states of any of the switches therein.

As will be familiar to the skilled person, when using a first arm 102a of a pair to construct the positive half-cycle of an ac sinewave and the other arm 102b a pair to construct the negative half-cycle, the maximum voltage that each stack of cells 104 produces is equal to half of the dc bus voltage.

As the voltage that can be supported by semiconductor switches, i.e. their voltage rating, is limited and, as the rating increases, so does cost, the function of a director switch 108 is not usually performed by a single switching element.

Figure 2:
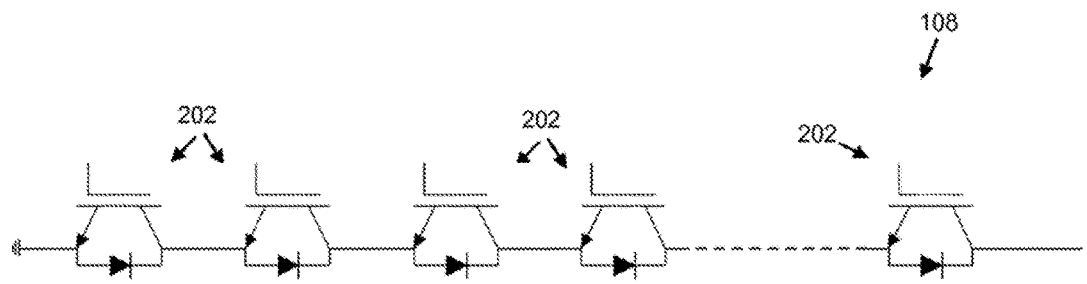
FIG. 2 shows a first embodiment of a switch.

An example of a switch 108 suitable for use within an AAC 100 (or another multilevel converter) is shown in FIG. 2. The switch 108 comprises a series combination of semiconductor switching elements 202, in this case Integrated Gate Bipolar Transistors (IGBTs). In a typical example, there may be tens of, or even a hundred or more, switching elements 202 in a switch 108.

In the examples described herein, the number of switching elements 202 in the series connection is determined given the need withstand the maximum voltage which could be applied across the director switch 108 when it is (as a whole) in the blocking (non-conductive) state.

It is usual to ensure that the individual voltage supported by any single switching element does not exceed its maximum recommended working voltage, which may be defined in terms of its Collector-Emitter Voltage, usually designated $V_{CES}$. The $V_{CES}$ of a switching element 202 is generally set out in a device data sheet as the maximum recommended voltage between the collector and emitter terminals with the gate shorted to the emitter and is generally the voltage level above which leakage current begins to increase to a significant level. However, this value is temperature dependent and subject to manufacturing variability and therefore the maximum advisable $V_{CES}$ in a practical use of a particular switching element may be different, and may be lower than that stated in a data sheet (for example, around 60%). This means that the skilled person, when designing a circuit, may be conservative such that the $V_{CES}$ is never reached in practice.

If it can be assumed that there is ideal voltage sharing between switching elements 202 when the switch 108 is turned off, applied voltage should be shared equally by all switching elements 202. However, as tolerance differences are seen between switching elements 202 in terms of their capacitance, resistance and leakage current, it may be the case that there is an imbalance in the voltages across a series connection of switching elements 202. Therefore, as will be discussed in greater detail below, voltage sharing apparatus, such as grading resistors and 'snubber' capacitor(s) may be provided.

In a typical switching application (such as in system with pulse width modulation control), a switching element may be subjected to two levels of voltages: low and high. In other applications, a sine wave voltage at AC frequency can be applied to semiconductor device with slow control. In further applications, such as when used as the director switch 108 in a AAC 100, an open switch may be subjected to a range of voltages varying in a quantised (stepwise) manner.

In this example, the switch 108 is required to support a voltage having a form which is predetermined, and which changes in a quantised manner (although other voltage forms are possible).

Figure 3:
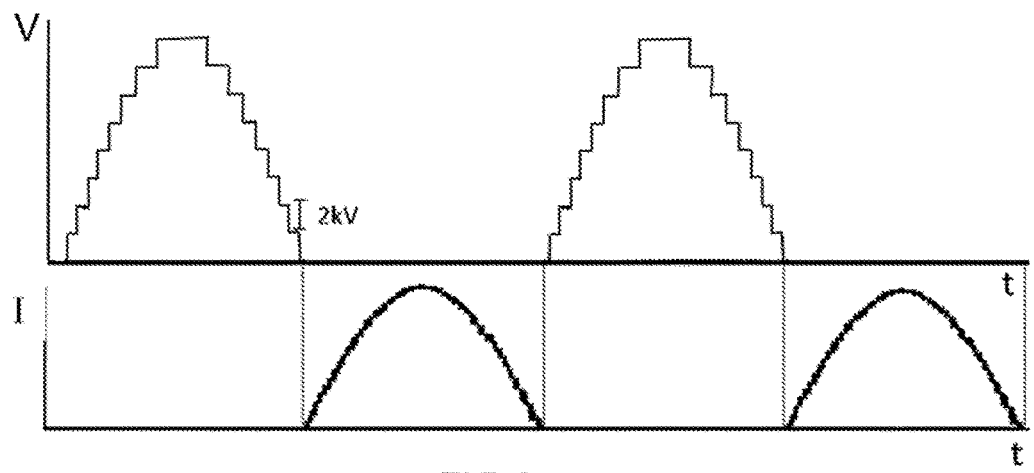
FIG. 3 shows voltage and current across a director switch.

By way of example, the voltage and current across particular director switch 108 of an AAC 100 is shown in FIG. 3. When the director switch 108 is in blocking state (i.e. the director switch 108 acts to isolate the cells 110 of the arm 102 from the AC side connections), the voltage V which it is required to support has a stepped shape. It can be characterised by an initial voltage step of a defined magnitude lower than the maximum voltage followed by smaller, well defined steps in voltage until the maximum voltage is reached. As can be seen, when the switch 108 is in a conductive state, a half cycle of an AC current I passes therethrough.

It will be noted that, in the illustrated example, there is a zero current condition at the start of the cycle. This may not always be the case. If there is a high reactive load, the current may flow in 'reverse', i.e. flowing through the diodes of the cells. An AAC may be operated in 'overlap' mode such that director switch is open for more than half a cycle. In such a mode, there is a period where both arms are in conduction and DC current can be circulated. Further, in certain abnormal conditions, there is a possibility that the current may still be circulating in an arm 102 when the switch 108 is caused to open. However, operation of the method now described does not require an initial zero-current state and further consideration of the possibility of non-zero current operation is provided below.

The voltage steps may be relatively small compared to the peak voltage, in this example being in a region of approximately 2 kV, with an initial larger step.

Thus, when the director switch 108 is first opened, the voltage across it is relatively low. However, this may still be high enough to exceed the voltage limits for a single switching element 202 within the director switch 108.

According to one embodiment of the invention, the controller 118 is arranged to control the individual switching elements 202 of the director switch 108 according to the voltage which it is required to support, or about to support, at that time. Not all of the switching elements 202 are placed in a blocking state for the switch 108 to perform a blocking function at all times. Instead, some switching elements 202 will be left in a conductive state. As the voltage increases, the controller 118 controls the switching elements 202 such that number of switching elements 202 in the blocking state increases. Put another way, the number of switching elements 202 in blocking state tracks the voltage, at least to an extent. This approach will effectively, at least to an approximation, size the director switch 108 to its voltage supporting requirement.

A particular example is now described with reference to FIG. 4, which considers an example director switch 108 comprising one hundred 3.3 kV switching elements 202 (in this case, IGBT devices) connected in series, each with a nominal voltage rating of 2 kV. The voltage across the switch 108 has the profile shown in FIG. 4.

In the conventional approach, all the switching elements 202 would be placed in blocking state at time T1. With ideal voltage sharing between switching elements 202, each of the one hundred switching element 202 will support a $\frac{1}{100}$ share of the voltage, and a stepped voltage form would be seen across each switching element 202; i.e. 60V at T1, 100V at T3, etc. In practice, as mentioned above, voltage sharing may be ensured using grading resistors and snubber circuits as mentioned above, as each voltage step could in itself exceed the permissible voltage for a single switching element 202. In such examples, the voltage sharing apparatus must be arranged to be effective over wide voltage range, for example from 100% to 5% of full rated voltage across the switch 108.

In addition, as is described in greater detail below, there may be auxiliary circuitry. As used herein, the term 'auxiliary circuit' is any circuit which is associated with one or more switching element 202, and includes circuits that control at least one function of at least one switching element, those which control or balance parameters between switching elements; and/or those which harvest energy from at least one associated switching element when the switching element is in the blocking state.

In the embodiment of the invention now described, instead of turning all the switching elements 202 in the switch 108 into their blocking state at once, only a subset of switching elements 202 is switched initially, while the rest of the switching elements 202 remain in their conductive state. In this embodiment, the minimum number of switching elements 202 which are required to support the actual, or imminently expected, voltage at a given time are controlled to be in their blocking state.

Figure 4:
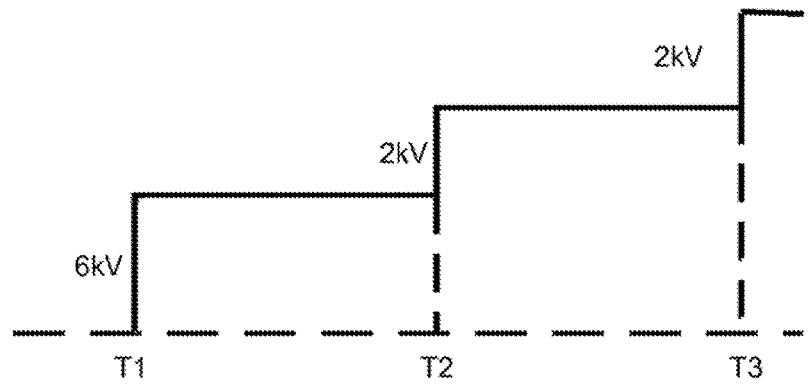
FIG. 4 shows detail of a voltage across a director switch.

For the particular example of FIG. 4, at time T1, only three switching elements 202 are required to support 6 kV so only three out of 100 switching elements 202 will be controlled by the controller 118 to be in their blocking state. In other examples, redundancy may be added and four or more devices may be controlled into their blocking state to support the first voltage step. Controlled in this manner, the voltage across off switching elements 202 is at or close to full rated voltage for that switching element 202.

At (or before) the point T2, four switching elements 202 are controlled such that they are in a blocking state, such that they supporting their full, or close to full, rated voltage. These four switching elements 202 may or may not include any of the three switching elements 202 in their blocking state between T1 and T2: new switching elements 202 can be selected from all the switching elements 202 within the director switch 108. Some examples of methods for selecting which switching elements 202 are operated at what time are set out in greater detail below.

In this way, as the voltage magnitude increases, an increasing proportion of switch elements 202 are controlled into the blocking state. Similarly, as the voltage magnitude decreases, an increasing proportion of switching elements 202 may be controlled into their conductive state.

Effectively, this allows the effective rating of the switch 108 to be matched, at least to an approximation, to the actual voltage which is applied. Controlling the switch 108 in this manner has a number of advantages including but not limited to the following, allowing optimisations in circuitry associated with the switch 108 as discussed below, and allowing switching elements 202 to be 'rested' in their conductive, or 'ON' state. It will be appreciated that, while the switching elements 202 could conduct while in their conductive state, if there is no significant current flowing they may not actually be conducting while in the conductive state. It will be further appreciated that, while a switching element 202 is in a conductive state, but not actually conducting, it is subject to less thermal stress.

In this example, there is a defined value for the first voltage step (when the director switch 108 first turns off) and defined values for the subsequent steps. The initial "turn off" may be a more stressful event as some current can be present within the director switch 108. For all other transitions, in normal operating conditions, the only current flowing through the director switch 108 is leakage current, which is small. Such transitions can therefore be assumed to be low stress and are associated with minimal losses. Therefore, switching elements 202 within the director switch 108 which are used for each of the transitions can be selected according to their role. For example, the switching elements 202 which perform the director switch OFF and/or ON state change could be optimised for this (potentially) relatively stressful event, the other switching elements 202 may only be used for intermediate steps and therefore can be selected on this basis, for example having less onerous rating requirements (as the anticipated stress is less), which may reduce cost, and/or may mean that the switching element could be more freely selected for other requirements, such as a low on-state voltage drop, which might not for example be available (or might be available only at a higher cost) in combination with a high rating.

Indeed, the switching element(s) 202 which perform the director switch OFF and/or ON state change could be a different class of device to the other switching elements, for example being IGBTs, while the other switching elements 202 could be associated with a relatively low conductive state voltage drop (e.g. thyristor type switching elements), as this may reduce loses in a circuit.

For example, MOS gated thyristors normally have better ON state capability which is manifested in a lower forward drop. However, compared to IGBTs, they can be slower, lossier and/or less robust. A MOS-gated thyristor may therefore be selected for use to provide a switching element 202 does not need to participate in interrupting current, providing better on state losses than an IGBT performing a similar role. Alternatively, two different type of IGBTs may be used, each optimised for different operating points. Both type may have the same OFF state voltage capability, one being selected to have higher ON state voltage and being capable of interrupting full rated current while the other will have lower ON state voltage but need not have capability to switch full rated current.

As mentioned above, in some examples, in particular where the period between voltage steps is long enough to be considered as a DC condition for the director switch 108, voltage sharing between switching elements 202 should be considered and auxiliary circuitry comprising voltage sharing apparatus may be provided.

FIG. 5 shows a second example of a director switch 500 in which each switching element $202_{1-n}$ is associated with voltage sharing apparatus in the form of a grading resistor $502_{1-n}$ collectively providing a passive grading circuit.

The resistance value chosen for grading resistors 502 is usually a compromise between high resistive values which minimise the current through the resistors at peak voltage, thus reducing losses, and low resistive values which ensure proper voltage balancing at lower voltages. To meet this compromise, grading resistors 502 are often specified such that current through them is about ten times higher than maximum device leakage current specified for the associated switching element 202.

Consider the situation if all the switching elements 202 were to operate at once to open or close the switch 500 of FIG. 5 across which the voltage form of FIG. 3 was applied. If the maximum voltage which is anticipated across the switch (i.e. the highest voltage in FIG. 3) is used for calculation of the desirable resistor value, then there will be low losses and good voltage sharing performance at the high end of the voltage range. However, when the switch 500 is first controlled to enter the blocking state, the voltages observed would likely be at least 10 times lower than peak voltage. As a result, the current through the grading resistors 502 will also be ten times lower and will be comparable to the leakage current of a switching element 202, resulting in diminished voltage balancing, which may therefore mean that individual switching elements 202 may be subjected to excessive voltages. If instead the grading resistors 502 are specified for this lower end of the voltage range across the switch 500, this ensures adequate voltage distribution across devices at all off state voltages, but (as the resistor values would be around ten times lower than in the 'high voltage' approach) this would lead to additional power loss as the voltage increases and possible increases in the cooling requirement.

In a particular example, the switching elements 202 are 3.3 kV IGBTs with a nominal off state voltage of 2 kV per switching element 202 and a leakage current of 5 mA. The grading resistors 502 each have a resistance $R_{grade}$. When a switching element 202 is ON, i.e. in a conductive state, its resistance is considerably lower than $R_{grade}$ and the current will flow through the switching element 202. During OFF state of the switching element 202, i.e. when the switching element 202 is in its blocking state, the balance of current will depend on the voltage applied across switching element 202/grading resistor 502 pair and, at full rated voltage of 2 kV, it is desirable that most of the current will flow through the resistor 502.

Conventionally, the resistive value of the grading resistors 502 will be calculated based on nominal voltage, assuming 10 times higher than current in the grading resistors 502 gives resistor value of:

$$R=2\text{ kV}/(10*5\text{ mA})=40\text{ kOhm}.$$

As noted above, this value would work well for full rated voltage.

However, the current I through the resistors 502 during first voltage step (100V applied across 40 kOhm resistor) is:

$$I=100\text{V}/40\text{ kOhm}=2.5\text{ mA}.$$

This current is lower than switching element leakage current therefore grading resistors 504 would not affect voltage distribution across the switch 500 at this voltage level, and there is a risk that the voltage on a single switching element can exceed nominal maximum level.

To avoid this situation, grading resistors 502 can be sized according to the first voltage step resulting in a resistor value of:

$$R=100\text{V}/(10*5\text{ mA})=2\text{ kOhm}.$$

But at full voltage, high current through such a grading resistor 502 will generate 20 times higher power losses.

Figure 5A:
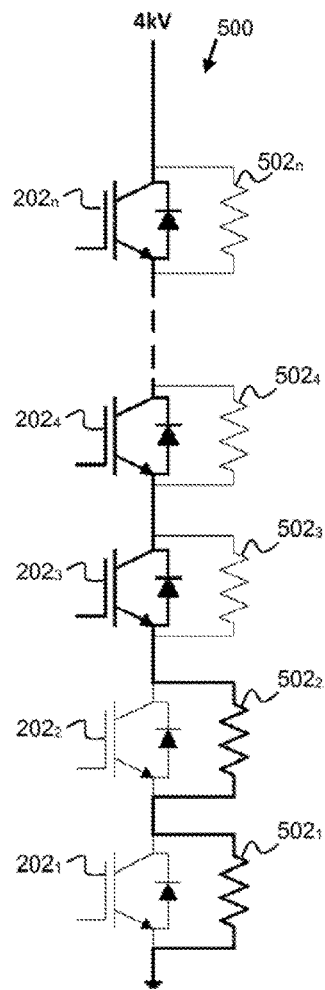
FIGS. 5A, 5B, and 5C show a second embodiment of a switch.

Now to consider an example embodiment of the invention with particular reference to FIG. 5 A-C. In a first state (FIG. 5A), the switch 500 supports 4 kV and a voltage step to 6 kV is anticipated.

As shown in FIG. 5A, the initial 4 kV state can be supported by two switching elements 202 (switching elements $202_1$ and $202_2$ in the figure). Therefore, two switching elements $202_{1,2}$ are turned OFF (are in a blocking state) and the rest of the switching elements $202_{3-n}$ are ON (i.e. in a conductive state). The 4 kV is supported by the two OFF switching elements $202_{1,2}$ and the grading resistors $502_{1,2}$ associated with these switching elements $202_{1,2}$ are selected such that the voltage is shared uniformly between the switching elements $202_{1,2}$. The current flow is represented as a bold line.

Figure 5B:
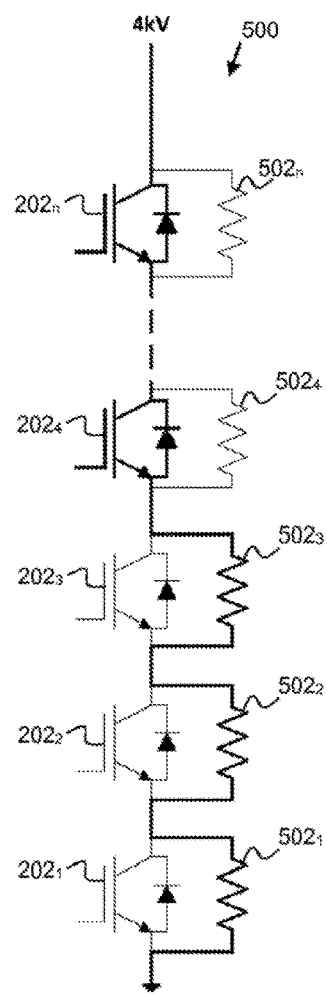

For the next voltage step up (FIG. 5c) the voltage across the switch will be 6 kV, requiring another switching element 202 to be in the blocking state. In this example, as shown in FIG. 5b, another switching element $202_3$ is controlled into its blocking state prior to application of the anticipated higher voltage based on the predetermined voltage form. This reduces the voltage applied across each switching element $202_{1-3}$ but this reduction is moderate (each then supporting $\frac{2}{3}^{rd}$ of its rated voltage), and therefore the associated grading resistors $502_{1-3}$ can perform voltage distribution adequately. The switching element $202_3$ is switched while supporting a very low current (the director switch 500 as a whole is in a blocking state thanks to the two blocking switching elements $202_{1,2}$) and therefore switching losses are minimal.

Figure 5C:
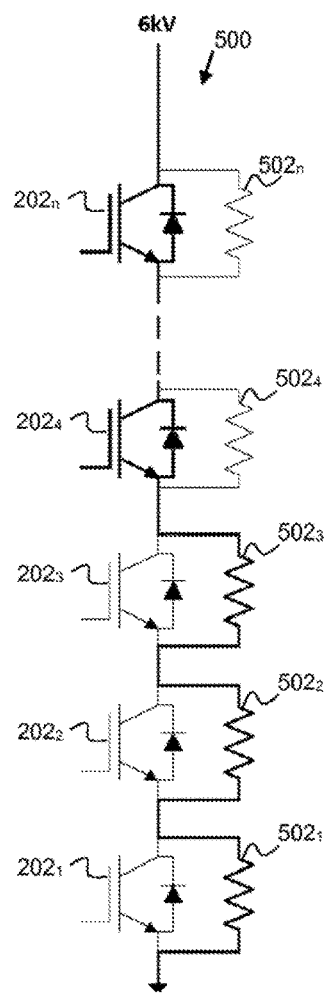

When, as shown in FIG. 5c, a 6 kV voltage is applied, the grading resistors $502_{1-3}$ ensure that the voltage is shared equally shared between OFF switching elements $202_{1-3}$.

This example assumes that the voltage will be shared such that no one switching element 202 supports more than its rated voltage. However, in practise, some redundancy may be added such that the total voltage supported by the switch 108 is always less than the sum of the rated voltages of the switching elements 202 which are in the blocking state.

It may be also be that additional redundancy is provided at the low voltage regions of operation as there are fewer switching elements 202 employed at this stage (and therefore, the impact of any one switching element failing to operate at its anticipated performance standard is more apparent). For example, the appropriate number of switches elements may be switched such that, for the initial one or few switching states, each switching element nominally supports around ½ or ¾ or the like of its rated voltage, and the level of redundancy gradually reduced until, at the maximum voltage across the switch 500, each of the switching elements in the blocking state are supporting close to (or their actual) rated voltage. Typical values of $R_{grade}$ may be in the tens or hundreds of kOhm range.

In the example above the extra switching element 202 was operated before the voltage increased. However, this need not be the case and in other examples different timing strategies may be applied, depending for example on the switching element 202 type or condition (for example different strategies can be used while the applied voltage increases to those used while the applied voltage decreases). For simplicity of operation and control, in some cases operate, one or more switching elements simultaneously with voltage step change.

It will be appreciated that, while a switching element 202 in its conductive state (i.e. ON), the associated grading resistor 502 will cause minimal energy losses as the majority of the current will pass through the switching element 202.

As will be familiar to the skilled person, other voltage sharing apparatus may be used to balance the voltage over a series connection of switching elements 202. For example, RC grading circuits, in which the resistors 502 in FIG. 5 are replaced by a series connection of a capacitor and resistor, may be used to perform voltage sharing at operating frequency. Specification of these elements similarly relates to the semiconductor device blocking voltage and leakage current. Snubber circuits may alternatively or additionally be provided.

Figure 6:
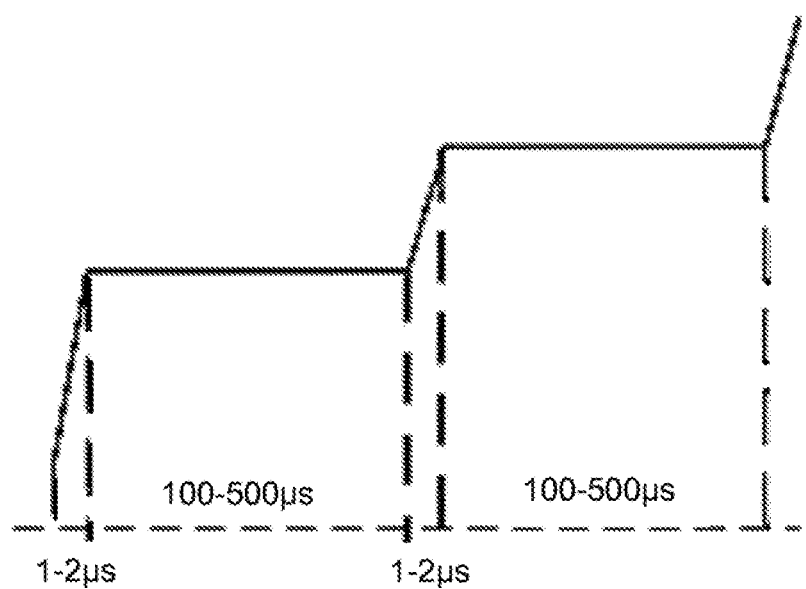
FIG. 6 shows detail of a voltage across a director switch.

As shown in FIG. 6, in some examples, when considered in detail, the voltage profile of each step change in voltage across a switch 108, 500 has two distinct characteristics. In a first phase, rapid switching of cells within the stacks 104 results in a voltage ramp across the director switch 108, 500. The gradient of this ramp is determined by the switching speed of cells 110 within a stack 104 and the entire voltage step change may typically occur in the region of 1-2 µs. The second phase is a relatively long "relaxation" period where the voltage applied is constant. The switching frequency of the converter 100 will determine duration of this interval, which may for example be in a region of 100-500 µs.

In the examples described above in particular with reference to FIG. 5A-C, switching elements 202 which are turned off within director switch 108, 500 are at or reasonably near their maximum rated voltage, therefore having their depletion region fully established and their output capacitance at a low value. A grading resistor 502 can be selected so that the time constant associated with the output capacitance of the switching element 202 and its associated grading resistor 502 is less than the "relaxation" time period. This means that, even absent capacitive snubber elements, such grading resistors 502 can successfully balance voltages across switching elements 202 within director switch 108, 500, which may eliminate or substantially reduce the need for other voltage sharing apparatus such as snubber circuits.

The state of each switching element 202 of a director switch 108, 500 is controlled by the controller 118. In this example, the controller 118 comprises processing circuitry to determine the timing of a change of state of a switching element 202.

This can be synchronised with the director switch 108, 500 voltage profile (i.e. with the switching of cell(s) 110 within the stack 104), or can be done in advance (in particular as the voltage magnitude increases) or following (in particular as the voltage magnitude decrease) a step change. However, in some examples, it may be desirable to ensure that the voltage capability level of the switching elements 202 supporting the voltage applied is always higher than applied voltage magnitude, providing some redundancy and for any variations in real-world device characteristics.

In one example, the first and the last state change of a number of switching elements 202 is synchronised with director switch 108, 500 voltage to transition of director switch 108, 500 as a whole from it ON (conductive) to OFF (blocking) state and vice versa.

Examples regarding the selection of which switch element 202 to operate are now discussed.

In one example, the controller 118 may be arranged to select which of the switching elements 202 to switch using an 'open loop' (i.e. without feedback or control signals based on a measured parameter) switching scheme. A switching scheme for selecting which of the switching elements 202 is the switched at a given time may be consistent over one AC cycle or over a number of AC cycles. For example, during a first cycle, switching element $202_1$ can be controlled into its blocking state first, followed by switching element $202_2$, then switching element $202_3$ and so on, with the sequence being reversed to control the switching elements 202 back into a conductive state as the voltage falls. During the next half cycle, the same or a different switching element may be chosen as the first to control into its blocking state, for example $202_2$, and the cycle continues with each switching element 202 in turn as in the first cycle. Of course, it will be appreciated the particular switching elements 202 identified are merely by way of example, and the switching elements 202 could be operated in any order.

In other examples of open loop control, a random or pseudorandom selection of switching elements 202 may be made, or there may be any predefined switching pattern.

In other examples, the controller 118 may operate a closed loop switching scheme, in which the controller 118 may receive an indication of one or more parameters, and this indication could be used in determining which switching element(s) 202 is/are controlled to change switching state. For example, indications may relate to one or more of the following: Switching element 202 temperature.

A 'hot' switching element 202 can be rested (have nearly zero voltage and zero current applied) by keeping it in or switching it to its conductive state, thus allowing it to cool down, which can lead to an increased life span of the switching element and/or to a reduced requirement for a cooling system.

Status of Auxiliary Circuitry

In some examples, auxiliary circuitry may be provided in association (for example parallel) with a switching element 202 (this may for example be in place of or alongside a grading resistor). If the switching element 202 is an IGBT for example (or any of a number of other semiconductor switching devices), such auxiliary circuitry may comprise a capacitor, and the voltage across a capacitor could be used in selecting a switching element 202.

Power Requirement/Available Power of Auxiliary Circuitry.

An auxiliary circuit of a switching element 202 within a director switch 108, 500 (for example, a gate driver as mentioned above) may be one that uses power harvested from the voltage supported by at least one switching element 202 in its blocking state. Therefore, the controller 118 may be arranged to ensure that each switching element 202 is in the blocked state for a sufficient period of time required to harvest enough power. It will be appreciated that, for example, at the 'peak' of the voltage waveform, some switching elements 202 could be in the blocking state for only a relatively short period, leaving little time to charge up the power supply of such an auxiliary circuit. Therefore, one switching scheme could ensure that switching elements 202 which are switched to their blocking state relatively late in the cycle remain in the blocking state after those which were switched to a blocking state relatively early in the cycle. Other embodiments, in which a single power harvesting circuit is associated with more than one switching element 202 are discussed below.

Any power harvesting circuitry can be optimised for a narrower range of voltages as the voltage profile across a switching element 202 when in its blocking state will generally be less variable per unit time than if all switching elements 202 were placed into their blocking state at once.

Switching Element 202 Usage History/Previous States

For example, this may include a consideration of how recently a switching element 202 has been operated, or how frequently in comparison to other elements 202, or the time spent in a given state.

As has been mentioned above, an auxiliary circuitry may comprise at least one circuit which uses power harvested from the voltage supported by at least one switching element 202 and therefore switching strategies may be employed to ensure that an associated switching element spends sufficient time in a blocking state to allow energy to accumulate. However, alternatively or additionally, switching elements 202, as is now discussed in relation to FIG. 7, may be grouped with common power harvesting within the group.

Figure 7:
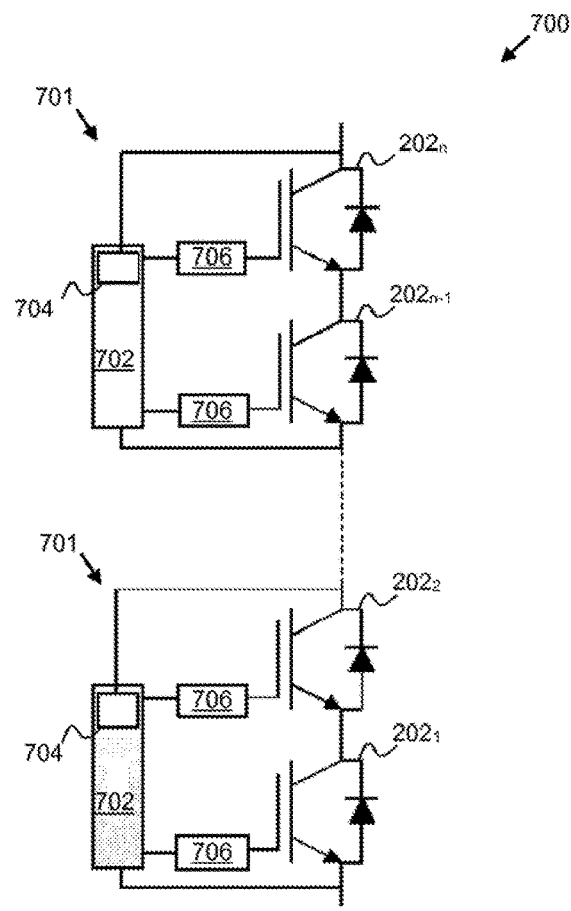
FIG. 7 shows a third embodiment of a switch.

FIG. 7 shows an example of a switch 700 in which switching elements 202 (in this case, IGBTs) are functionally grouped into pairs each forming a subset 701 sharing a common gate power supply unit 702 and having a common energy harvesting and storing device which in this example comprises a power harvesting module 704. It may be convenient to form the subset 701 with switching elements 202 which are physically adjacent within the switch 700, although this need not be the case. Each of the switching elements 202 in a group has a gate drive 706 which is supplied power from the shared power supply unit 702.

While there are two switching elements 202 in a subset 701 in this example, there may be more. In addition, not all switching elements 202 in a switch 700 need be in a subset 701, and the subsets 701 need not comprise the same number of switching elements 202.

The switching elements 202 within subset 701 may for example be controlled such that, if one is to be operated at the peak voltage (and therefore to be in a blocking state for a relatively short amount of time), at least one other switching element 202 within that subset 701 is controlled to be operated at a different point in the AC cycle, so that it is blocking for longer and the power harvesting module 704 can harvest power from that switching element 202.

It may be that subsets 701 are controlled such that the total blocking time provided by the switching elements 202 in a subset 701 is substantially the same (or at least not significantly different) for all subsets 701. For example, considering a subset 701 comprising pairs, a first subset 701 could contain a switching element 202 controlled to have the longest OFF (i.e. blocking state) duration and a switching element 202 controlled to have the shortest OFF duration. Another subset 701 could contain the switching element 202 controlled to have the second longest OFF duration and a switching element 202 controlled to have the second shortest OFF duration, and so on. Switch elements 202 may alternatively or additionally be selected on the basis of the stored charge level.

Figure 8:
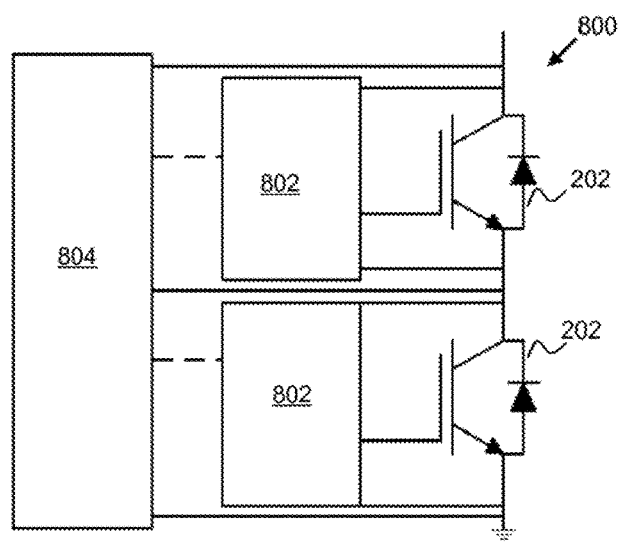
FIG. 8 shows an example of an arrangement of an auxiliary circuit and associated switching elements.
Figure 9A:
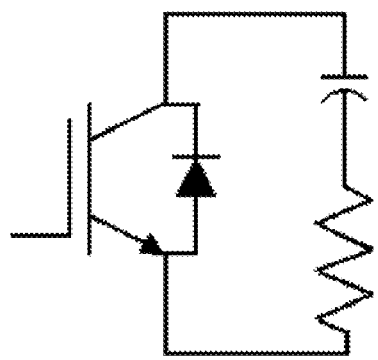
FIGS. 9A, 9B, 9C, 9D, 9E show examples of auxiliary circuits.
Figure 9B:
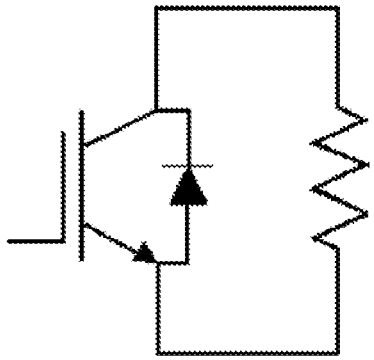
Figure 9C:
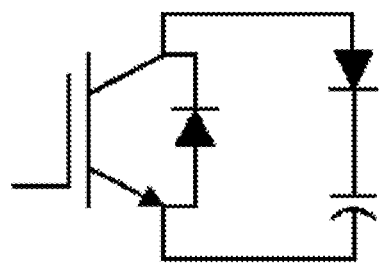
Figure 9D:
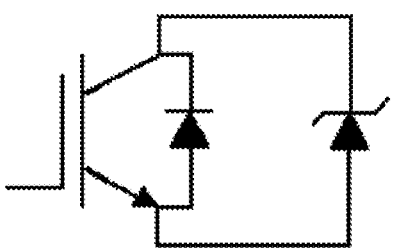
Figure 9E:
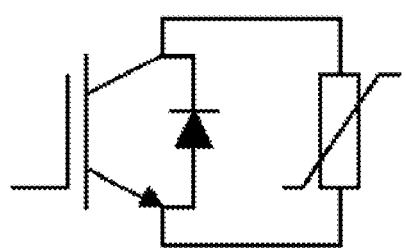

FIGS. 8 and 9A-E relate to auxiliary circuits, which may comprise active and/or passive electrical components connected to one, or a series of, semiconductor switch(es). FIG. 8 shows two types of auxiliary circuits. A first type of auxiliary circuit 802 is connected in parallel to each switching element 202 in a series string and can be connected to any, or all, terminals (i.e. anode, cathode and gate) thereof. A second type of auxiliary circuit 804 is shared between two switching elements 202 and can have connection to any, any combination, or all terminals of both switching elements 202 (in the illustrated example, the second type of auxiliary circuit 804 is connected to the cathode of the lower switching element 202 and anode of the top switching element 202).

A second type of auxiliary circuit 804 may be provided in isolation, but may also be employed with at least one first type of auxiliary circuit 802. A first type of auxiliary circuit 802 may be provided in isolation.

Each auxiliary circuit 802, 804 may comprise (or further subdivided into smaller sub-circuits comprising):

A power harvesting circuit, arranged to obtain, store and supply reliable power required by any other auxiliary circuits or sub-circuit.

A 'Gate Driver' circuit responsible of changing the conduction state of a switching element 202, which may typically comprise an auxiliary circuit of the first type 802, and may derive power from a power harvesting circuit A voltage balancing circuit to balance voltages across series connected devices. Such circuits may be active during the full operation cycle and may be designed for different frequencies. Voltage balancing circuits may for example be a resistor-capacitor snubber (see FIG. 9A) or a resistor-capacitor-diode snubber, DC grading resistors (see FIG. 9B) or the like. Control logic used to control and monitor these elements can be used as an input for control/selection algorithm for example with the aim to balance usage and optimise switching element 202 lifetime.

An Overvoltage protection/balancing circuit. An example of overvoltage balancing circuit may comprise a capacitor-diode snubber (see FIG. 9C), avalanche diodes (see FIG. 9D) or transient voltage suppressors (see FIG. 9E). Such circuits may become operational once the voltage across switching element 202 terminals exceeds a level, which may be the nominal $V_{ce}$ level. Once operational, such circuits operate to equalise voltages across switching elements 202 by limiting the rate of voltage change, for example, containing the spread within designed limits. Capacitor voltage may be monitored with a view to ensuring that it is at least approximately equal across the string of switching elements. This can be controlled by selecting a switching element 202 with lowest voltage/energy on the snubber capacitance to be in the blocked state. In some examples, snubber capacitance could form a part of an energy harvesting circuit. Some overvoltage protection circuits have capability to count number of times overvoltage stress has been applied. A switching element selection process may be arranged to share potentially stressful switching events over the available switching elements 202 to maximise lifetime of such protection circuits.

An Over-current protection/current sharing circuit, to divert part of the current from the switching element 202.

It will be noted that an AAC 100 (or other apparatus, such as other converters) may typically comprise a processor arranged to control the timing of switching within cells 110, and the control of other components, based on monitoring of the status of various components. Such a processor may comprise part of the controller 118 and therefore may also carry out control of switching elements 202 according to an algorithm, and/or may accept input relating to the status of the switching elements 202 and/or auxiliary circuits (e.g. temperature, charge level of power supply unit(s) 802, etc).

While the invention has been illustrated and described in detail in the drawings and foregoing description, such illustration and description are to be considered illustrative or exemplary and not restrictive; the invention is not limited to the disclosed embodiments. Features from one embodiment may be combined with features from another embodiment.

In particular, the invention has been described in the context of a director switch of an AAC. However, in other examples, such a switch may be found in other apparatus. For example, other multilevel converter topologies, such as that described in WO2010/088969, may comprise switches to connect a phase of an AC network to a converter (termed a phase element 40 in the above mentioned application), and such switches could comprise a switch controlled as described herein. A switch as described herein may also be used in a modular multilevel converter (often termed an MMC, or and M2LC), such as is described in WO2014/154265 in the name of ABB. The content of these documents is incorporated herein by reference to the fullest possible extent.

The invention has been described with respect to various embodiments. Unless expressly stated otherwise the various features described may be combined together and features from one embodiment may be employed in other embodiments.

It should be noted that the above-mentioned embodiments illustrate rather than limit the invention, and that those skilled in the art will be able to design many alternative embodiments without departing from the scope of the appended claims.

The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of breaking a circuit using a switch, wherein a variable voltage is applied across the switch and the switch comprises a series connection of switching elements which are individually controllable between a blocking state and a conductive state, the method comprising:
controlling the state of the switching elements such that at least a portion of switching elements are in the blocking state, wherein fewer switching elements are in the blocking state when the applied voltage magnitude is low than when the applied voltage magnitude is high.

2. The method of claim 1, wherein the portion of switching elements which are in the blocking state is determined such that each switch element supports at least a predetermined proportion of its rated voltage.

3. The method of claim 1, wherein the applied voltage comprises a predetermined stepped voltage form and the method comprises controlling the state of the switching elements in advance of a step change in the applied voltage, after a step change in the applied voltage, and/or simultaneously with a step change in the applied voltage.

4. The method of claim 1, wherein the step of controlling comprises changing the state of at least one switching element, and further comprises selecting which of the switching elements is/are controlled to change state according to a predetermined selection criteria.

5. The method of claim 4, further comprising determining data indicative of the state of at least one switching element and/or data indicative of auxiliary circuitry associated with the switch, and the step of selecting is based on the determined data and the predetermined criteria.

6. The method of claim 5, wherein the data is indicative of at least one of switching element temperature, a power supply charge level, a switching element switch state history, auxiliary circuitry status, switching element type.

7. A method according to claim 1 wherein the switching elements comprise a plurality of subsets of switching elements, and each subset is associated with an energy harvesting circuit capable of harvesting energy from all switching element in the subset when in the blocking state, and the method comprises selecting a switching element according to the requirements of an energy harvesting circuit of a subset.

8. A method according to claim 7 which comprises selecting switch elements to be in the blocking state such that the cumulative time in the blocking state for the switching elements in a subset is substantially equal and/or at least a threshold time period.

9. A switch apparatus comprising a switch and a controller,
the switch being arranged to break an electrical circuit and to support an applied variable voltage having a predetermined form;
the switch comprising a series connection of switching elements which are individually controllable between a blocking state and a conductive state;
and the controller being arranged to control the state of the switching elements to break the circuit according the voltage form such that, in use of the apparatus, fewer switching elements are controlled to be in the blocking state when the applied voltage is low than when the applied voltage is high.

10. The switch apparatus according to claim 9 further comprising auxiliary circuitry arranged to:
control at least one function of at least one switching element;
control or balance parameters between switching elements; or
harvest energy from at least one associated switching element when the switching element is in the blocking state.

11. The switch apparatus according to claim 10 wherein auxiliary circuitry comprises voltage sharing apparatus.

12. The switch apparatus according to claim 11 arranged such that, for all anticipated applied voltages, the current through the voltage sharing apparatus significantly exceeds the leakage current of the switching elements.

13. The switch apparatus according to claim 11 wherein the voltage sharing apparatus comprises a grading resistor arranged in parallel with each switching element and, in use of the switch apparatus, the applied voltage changes in a quantised manner at regular intervals, and the grading resistors are chosen so that the time constant associated with the output capacitance of a switching element and its associated grading resistor is less than the interval.

14. The switch apparatus according to claim 10 wherein the auxiliary circuitry comprises at least one energy storage device arranged to store energy from a potential difference across at least a first and a second switching element.

15. The switch apparatus according to claim 14 wherein the auxiliary circuitry comprises a plurality of energy harvesting devices, each arranged to harvest energy from a potential difference across an associated plurality of switching elements, and the controller is arranged to control the switching elements such that, when in use to break a circuit, the total time in the blocking state for switching elements associated with first energy harvesting device is substantially similar to the total time in the blocking state for switching elements associated with a second energy harvesting device.

16. The switch apparatus according to claim 9 wherein the switching elements comprise at least one of a first type of switching element and at least one of a second type of switching element, wherein the first type of switching element is selected for high current switching operation and/or the second type of switching element comprises low voltage drop characteristics.

17. The switch apparatus according to claim 9 wherein the controller is arranged to select which switch element should be in a blocking state based on at least one of: a predetermined switching pattern, random selection, pseudorandom selection, data indicative of the state of at least one switching element, data indicative of the switch state history of at least one switching element, switching element type, the status of the apparatus wherein the switching apparatus is employed, the status of auxiliary circuitry.

18. The switch apparatus according to claim 9 which is arranged to provide a controller and a director switch of an alternate arm converter, a multilevel converter, and/or a series bridge converter.

19. A controller for controlling a switch arranged to break a circuit having a variable voltage having a known voltage form, the controller comprising:
the switch comprising a series connection of switching elements which are individually controllable between a blocking state and a conductive state; and
the controller being arranged to open the switch by controlling at least a portion of the switching elements to be in the blocking state such that fewer switching elements are in the blocking state when the applied voltage low than when the applied voltage is high.

* * * * *